(12) United States Patent
Chakraborty et al.

(10) Patent No.: US 9,728,273 B2
(45) Date of Patent: Aug. 8, 2017

(54) EMBEDDED MEMORY TESTING USING BACK-TO-BACK WRITE/READ OPERATIONS

(71) Applicant: Lattice Semiconductor Corporation, Hillsboro, OR (US)

(72) Inventors: Kanad Chakraborty, Portland, OR (US); Naveen Purushotham, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 219 days.

(21) Appl. No.: 14/283,329

(22) Filed: May 21, 2014

(65) Prior Publication Data
US 2015/0340103 A1 Nov. 26, 2015

(51) Int. Cl.
*G11C 29/38* (2006.01)
*G11C 29/04* (2006.01)
(Continued)

(52) U.S. Cl.
CPC ........ *G11C 29/38* (2013.01); *G11C 29/12015* (2013.01); *G11C 29/12* (2013.01); *G11C 29/18* (2013.01); *G11C 2029/0401* (2013.01)

(58) Field of Classification Search
CPC ... G11C 29/12; G11C 29/12015; G11C 29/18; G11C 29/36; G11C 29/3602;
(Continued)

(56) References Cited

U.S. PATENT DOCUMENTS 5,075,892 A 12/1991 Choy
6,120,551 A 9/2000 Law et al.
(Continued)

OTHER PUBLICATIONS

Kanad Chakraborty, et al., "A Programmable Boundary Scan Technique for Board-level, Parallel Functional Duplex March Testing of Word-Oriented Multiport Static RAMs," IEEE, European Design and Test Conference (ED&TC) 1997, pp. 330-334.
(Continued)

*Primary Examiner* — Albert Decady
*Assistant Examiner* — Christian Dorman
(74) *Attorney, Agent, or Firm* — Haynes and Boone, LLP

(57) ABSTRACT

In one embodiment, a BIST (built-in self-test) engine performs BIST testing of embedded memory in an integrated circuit device (e.g., an FPGA) via an (e.g., hard-wired, dedicated, low-latency) bus from the configuration bitstream engine. During BIST testing, data is written into the embedded memory at-speed, which may require the bitstream engine to produce a higher frequency than originally used for configuration. Between consecutive write operations, the BIST engine is capable of reading the previously written set of data from the embedded memory and comparing that read-back data with the corresponding original set of data to determine whether a BIST error has occurred. By performing back-to-back write/read-back operations faster than the configuration speed and using a dedicated W/RB bus, BIST testing can be optimally performed without false-positive-invoking delays and undesirable resource utilization.

10 Claims, 6 Drawing Sheets

(51) Int. Cl.
*G11C 29/12* (2006.01)
*G11C 29/18* (2006.01)

(58) Field of Classification Search
CPC ..... G11C 29/38; G11C 29/40; G11C 29/4002; G11C 2029/0401
See application file for complete search history.

(56) References Cited

U.S. PATENT DOCUMENTS

| | | |
|---|---|---|
| 6,560,740 B1 | 5/2003 | Zuraski, Jr. et al. |
| 7,409,610 B1* | 8/2008 | Drimer .......... G01B 31/318544 326/39 |
| 7,484,144 B2 | 1/2009 | Han et al. |
| 7,630,259 B1 | 12/2009 | Han et al. |
| 7,944,765 B1 | 5/2011 | Han et al. |
| 8,004,915 B1* | 8/2011 | Dastidar ................ G11C 29/12 365/201 |
| 2004/0190331 A1* | 9/2004 | Ross ................. G11C 29/1201 365/154 |
| 2007/0157059 A1* | 7/2007 | Tsao ................... G01R 31/3187 714/733 |
| 2009/0245001 A1* | 10/2009 | Hiraide ............. G11C 29/1201 365/201 |
| 2011/0029827 A1* | 2/2011 | Chickanosky ......... G11C 29/14 714/718 |

OTHER PUBLICATIONS

Kanad Chakraborty, et al., "New March Tests for Multiport RAM Devices," Journal of Electronic Testing: Theory and Applications 16, 2000, pp. 389-395.

Kanad Chakraborty, et al., "Testing and Reliability Techniques for High-Bandwidth Embedded RAMs," Journal of Electronic Testing: Theory and Applications 20, 2004, pp. 89-108.

A. J. van de Goor et al., "The Automatic Generation of March Tests," IEEE Intl. Memory Technology, Design and Testing Workshop, 1994, pp. 86-91.

A. J. van de Goor, et al., "Fault Models and Tests for Two-Port Memories," 16th IEEE VLSI Test Symposium, 1998, pp. 401-410.

* cited by examiner

EMBEDDED MEMORY TESTING USING BACK-TO-BACK WRITE/READ OPERATIONS

BACKGROUND

Field of the Invention

The present invention relates to integrated circuits (ICs) and, more specifically but not exclusively, to built-in self-test (BIST) techniques for IC memory.

Description of the Related Art

This section introduces aspects that may help facilitate a better understanding of the invention. Accordingly, the statements of this section are to be read in this light and are not to be understood as admissions about what is prior art or what is not prior art.

There are a variety of memory BIST (built-in self-test) approaches for field-programmable gate arrays (FPGAs) that use fabric resources to test embedded memories at their rated frequency of operation. One drawback of these approaches is that they rely on software-programmable routing resources in the FPGA fabric and often do not achieve worst-case stress conditions for minimum-delay paths due to latencies in the fabric routing. This might lead to defective parts being shipped to customers and consequent customer returns. For example, one possible defect relates to a hold-time issue in an input register within an embedded RAM (random-access memory) block.

Another disadvantage of using fabric-based BIST testing to test FPGA embedded memory at-speed is the resource utilization on the FPGA. (As used herein, the term "at-speed" refers to the normal configuration clock frequency of the device being tested.) Since the fabric may be used to build BIST engines for hundreds of different blocks of embedded memory, the multiple BIST masters create a lot of congestion for the place-and-route tool, thereby resulting in a lower-speed design, which defeats the purpose of the test. Limiting the number of BIST masters would add delay to the programmable routes from those masters to the embedded memory blocks, thereby resulting once again in a lower-speed design.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
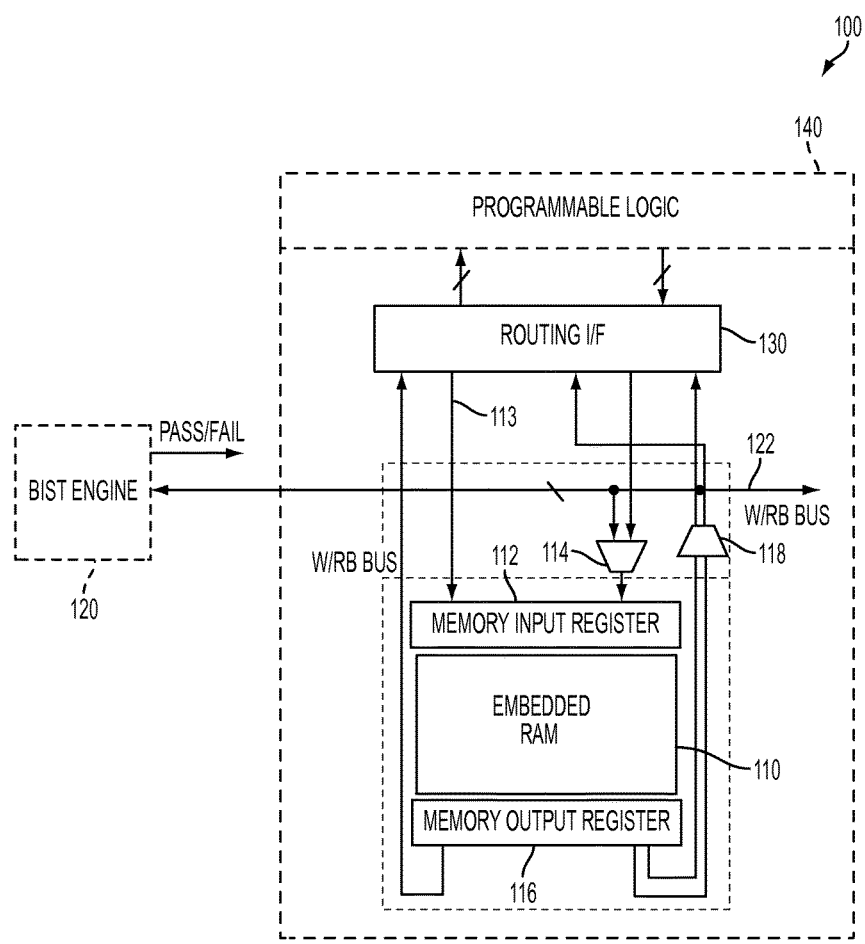
FIG. 1 shows a simplified block diagram of a portion of an FPGA that supports BIST testing of an exemplary block of embedded RAM according to one possible embodiment of the disclosure.

U.S. Pat. Nos. 7,409,610 B1; 7,484,144 B2; and 7,630,259 B1, the teachings of all of which are incorporated herein by reference in their entireties, describe alternative approaches for configuration-logic-based BIST testing for FPGA memories. In these approaches, the clock frequency applied during RAM test is not matched to or even close to the RAM functional frequency (also known as "at-speed configuration frequency") specification, thereby limiting the ability of these test approaches to provide enough stress to the RAM under test for screening random delay defects.

Unlike other memory BIST approaches, the current approach provides a "shadow-BIST" capability to a configuration logic memory preload operation that, in some cases, could have zero delay penalty for testing. Other memory test approaches tend to add test time for testing the memory blocks, and test time translates directly to test cost and product cost.

A memory BIST engine can be added to the bitstream engine in the configuration logic of an FPGA to allow back-to-back configuration (preload) and read-back of (i.e., writing to and reading from) embedded block RAMs at higher than at-speed configuration frequency in an attempt to match or exceed the rated frequency specification of the embedded RAM (assumed higher than that for the configuration logic), since it is well understood that random delay defects can be stressed more at higher frequencies versus at lower frequencies. Exceeding the rated frequency specification may be a requirement for testing the embedded memory under stress conditions designed to screen weak memory arrays. Such testing may be targeted toward customers demanding extremely low defect levels or toward applications where the device with the embedded memory will be operated in a harsh environment such as outer space.

If the rated frequency of the RAM block is lower than the rated frequency of the configuration logic, then this approach of successive writes and reads would need to be done at a lower frequency, resulting in some additional modifications in the configuration logic clock distribution (e.g., more clock division). In this case, however, the divided-down frequency of the configuration logic bitstream engine could end up being slightly lower than the rated frequency of the RAM, thereby making it possible to use this invention.

In one possible implementation, the higher frequency of back-to-back memory operations can be achieved by using an embedded PLL in the bitstream engine to produce two times the at-speed configuration frequency using a slower-speed reference clock. Back-to-back configuration and read-back does not add any overhead to the configuration time since the write and read operations are performed back-to-back without slowing down the write frequency.

Back-to-back configuration and read-back at high frequency can be used to produce high stress conditions on the memory cells and can be used to screen FPGAs with defective or weak embedded block RAM bits. Back-to-back configuration and read-back can be used as a test (e.g., BIST) feature or as a customer feature allowing customers to verify the preloaded RAM data (if any) downloaded from their application bitstream, without any additional effort and without any delay penalty.

FIG. 1 shows a simplified block diagram of a portion of an FPGA 100 that supports BIST testing of an exemplary block of embedded random access memory (RAM) 110 according to one possible embodiment of the disclosure. To support that BIST testing, FPGA 100 has BIST engine 120 and write/read-back (W/RB) bus 122. Embedded memory 110 is part of the FPGA's hard IP (intellectual property), while BIST engine 120 is implemented in the FPGA's configuration logic as part of the bitstream engine that handles the writing of data (including both BIST data and configuration data) into the FPGA.

Routing interface (I/F) 130 provides the FPGA's programmable logic (also known as soft IP or fabric) 140 with access to embedded memory 110. In particular, fabric 140 can write data to embedded memory 110 via routing I/F 130 and input register 112 either directly using path 113 or via (2×1) input multiplexer 114. In addition, fabric 140 can read data from memory 110 via output register 116 and (2×2) output multiplexer 118. Note that the other input to input multiplexer 114 is connected to W/RB bus 122 and that one of the two outputs from output multiplexer 118 is also connected to W/RB bus 122.

To perform BIST testing, BIST engine 120 writes a set of data into embedded memory 110 via W/RB bus 122, input multiplexer 114, and input register 112 and then reads that same data from embedded memory 110 via output register 116, output multiplexer 118, and W/RB bus 122. BIST engine 120 then compares a local copy of the data that it sent to embedded memory 110 with the data read-back from embedded memory 110 to determine if there are any differences. If one or more differences (e.g., bit flips) are detected, then BIST engine 120 determines that a BIST error has occurred. As described further below, depending on how BIST engine 120 is configured (e.g., programmed), the BIST engine 120 will either terminate BIST testing upon the first detection of a BIST error or it will continue BIST testing while counting the number of BIST errors detected during the current BIST testing session.

As also described further below, BIST engine 120 is specifically designed to perform BIST testing using a back-to-back (B2B) write/read-back (W/RB) mode that operates faster than the configuration speed, that is, faster than the normal operating speed at which the FPGA configuration bitstream engine writes data to and/or reads data from embedded memory 110. In one exemplary implementation, BIST engine 120 performs the B2B W/RB mode at two times the configuration speed.

Figure 2:
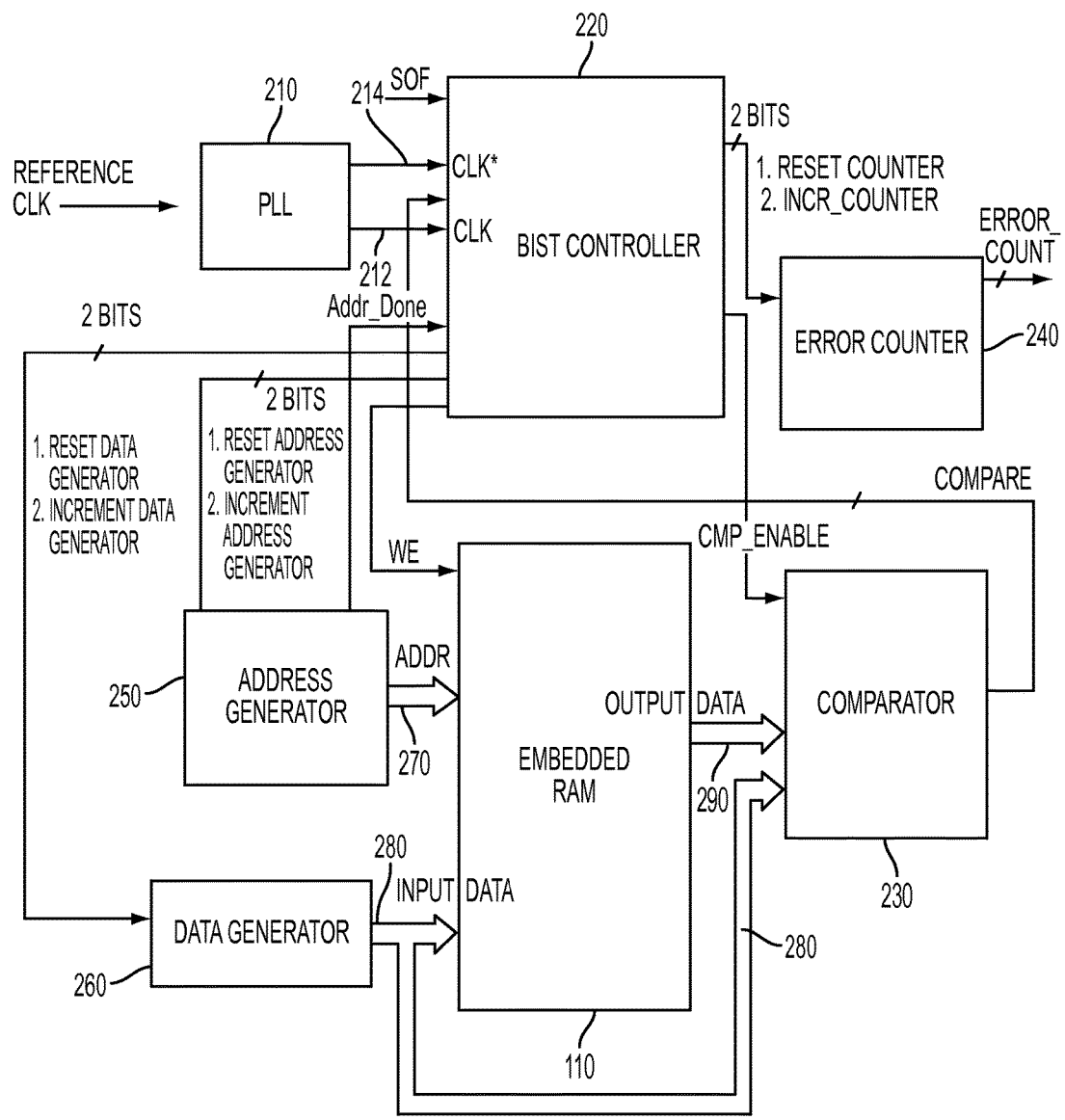
FIG. 2 shows a block diagram representing one possible implementation of some of the circuitry involved in BIST testing of the embedded memory shown in FIG. 1 in which the BIST testing is performed at two times at-speed.

FIG. 2 shows a block diagram representing one possible implementation of some of the circuitry involved in BIST testing of embedded memory 110 shown in FIG. 1 in which the BIST testing is performed at two times the configuration speed. In particular, phase-lock loop (PLL) 210, BIST controller 220, comparator 230, error counter 240, address generator 250, and data generator 260 may be considered to be part of BIST engine 120 of FIG. 1, while input address bus 270, input data bus 280, and output data bus 290 may be considered to be part of W/RB bus 122 of FIG. 1. Note that, as drawn in FIG. 2, input and output registers 112 and 116 of FIG. 1 are assumed to be part of embedded memory 110 and that multiplexers 114 and 118 of FIG. 1 are not shown in FIG. 2.

BIST controller 220, which could be implemented in hardware (e.g., using ASIC circuitry) or in software (e.g., using programmable circuitry), controls the operations of the other components of BIST engine 120.

In operation, PLL 210 receives a relatively low-frequency reference clock and generates (at least) two faster output clocks: a configuration speed (CS) clock 212 and a two-times-configuration-speed (2×CS) clock 214 that is twice the speed of CS clock 212. BIST controller 220 receives and uses the CS clock 212 and the 2×CS clock 214 to control BIST testing of embedded memory 110. In particular, during BIST testing, at every cycle of CS clock 212, BIST controller 220 causes (i) address generator 250 to load a new memory address value into the memory's address register Addr via input address bus 270 and/or (ii) data generator 260 to load a new set of data values into the memory's input data register Input Data via input data bus 280. Until the next cycle of CS clock 212, the address value stored in the address register Addr and the data value stored in the input data register Input Data are not changed. Note that the address register Addr and input data register Input Data are part of input register 112 of FIG. 1.

Furthermore, BIST controller 220 uses 2×CS clock 214 to control the write-enable signal WE for embedded memory 110 such that (i) write operations are performed at configuration speed and (ii) a single read operation is performed between every two consecutive write operations. For example, for every cycle of the CS clock 212, the write-enable signal WE is high for the half of the cycle and low for the other half of the cycle.

When the WE signal is high, embedded memory 110 is in write mode, which means that the data values currently stored in the input data register Input Data will be written into embedded memory 110 at the address value currently stored in the address register Addr. When the WE signal is low, embedded memory 110 is in read mode, which means that the data values currently stored in embedded memory 110 at the address value currently stored in address register Addr will be read from embedded memory 110 via output data register Output Data and output data bus 290. Note that the output data register Output Data is part of output register 116 of FIG. 1.

Optionally, another address generator and/or data generator can be added that generates only BIST-mode addresses and data for possible additional coverage. These generators can be multiplexed in with the input address and data generators used during user-mode or during manufacturing test (some of which may be off-chip—e.g., customer boot PROM during user mode, or ATE memory during manufacturing test).

Because, during BIST testing, BIST controller 220 toggles the WE signal two times (e.g., first on and then off) during each cycle of the CS clock 212, this means that data is written to embedded memory 110 at-speed, but before the next BIST write operation is performed, the data from the previous BIST write operation is read from embedded memory 110. Note that each BIST write operation may involve a set of data comprising one or more bits, where the size of each set of data may either be fixed or configurable, depending on the FPGA design.

For each BIST read operation, comparator 230 performs a bit-by-bit comparison between the data values written into embedded memory 110 during the first half of the current configuration-speed clock cycle and the data values read from embedded memory 110 during the second half of the current configuration speed clock cycle. If any one or more corresponding pairs of bits do not match, then comparator 230 determines that a BIST error occurred and therefore sets comparison output signal COMPARE to FAIL (e.g., low). Otherwise, comparator 230 determines that a BIST error did not occur and therefore sets (or maintains) comparison output signal COMPARE to PASS (e.g., high).

Depending on the design and/or configuration of the FPGA, error counter 240 can be used to count the number of BIST errors that have occurred during the current session of BIST testing as the output signal Error_Count. Note that a typical BIST testing session comprises a sequence of many BIST write operations over as many consecutive CS clock cycles. Alternatively, the FPGA may be designed and/or configured such that BIST testing is terminated upon the first detection of a BIST error, in which case the output Error_Count generated by error counter 240 would never exceed one.

Figure 3:
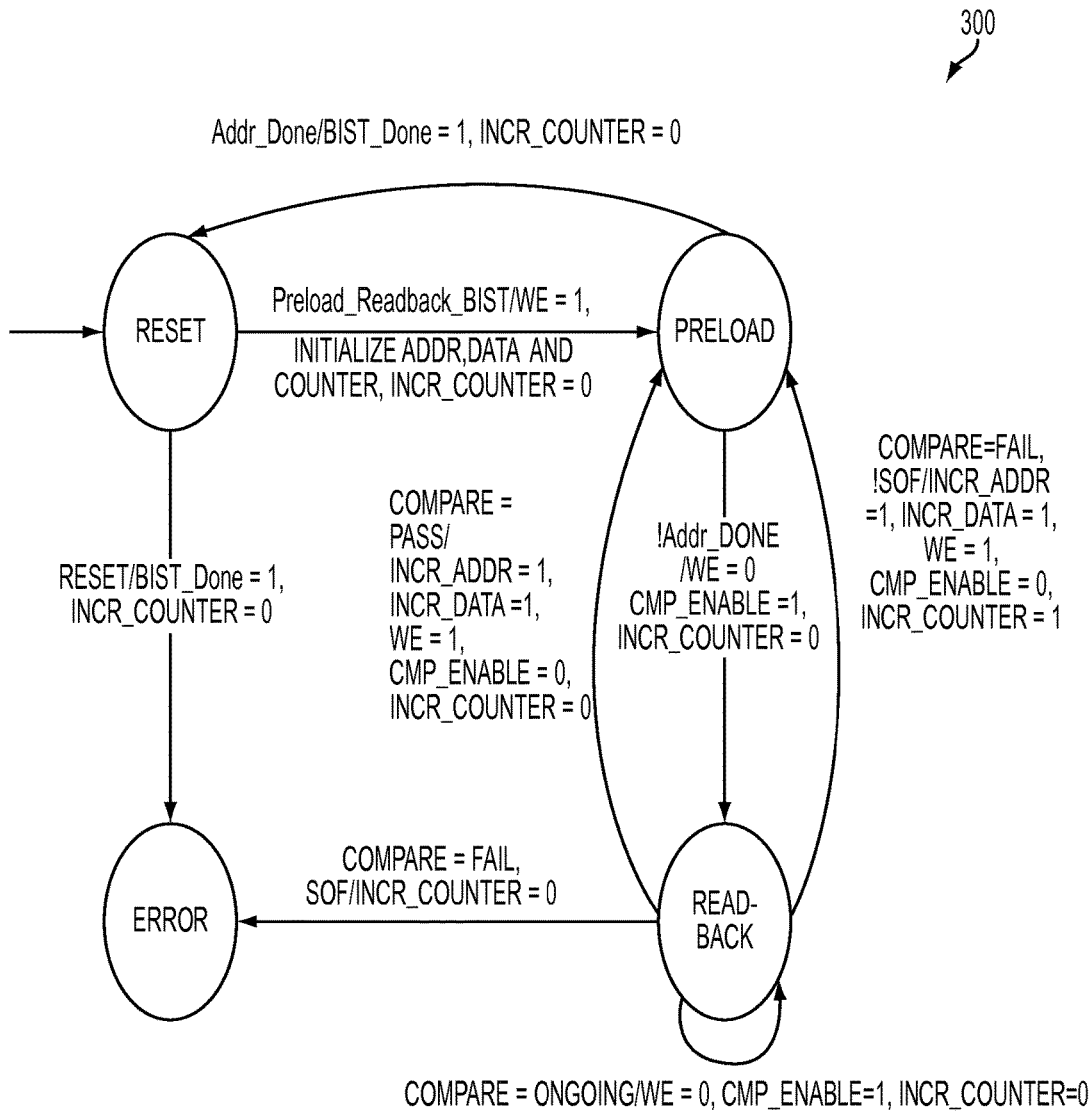
FIGS. 3-6 show representations of finite state machines that may be implemented by BIST controllers to control the BIST testing of embedded memory according to different possible implementations of the disclosure.

FIG. 3 shows a representation of a finite state machine (FSM) 300 that may be implemented by a BIST controller analogous to BIST controller 220 of FIG. 2 to control the BIST testing of an embedded memory having no input and output registers (for data, address, or write-enable signals) according to one possible implementation of the disclosure. Note that the depiction of FSM 300 in FIG. 3 follows the Mealy convention in which inputs are identified before the slash (/), and outputs after the slash. As shown in FIG. 3, FSM 300 comprises the following four states:

1) Reset: During which the BIST circuitry is initialized for implementation of a next BIST testing session;
2) Preload: During which a write operation is performed;
3) Read-Back: During which a read operation is performed and the memory output data register is loaded; and
4) Error: Where the BIST circuitry is parked following detection of a BIST error that terminates BIST testing.

The following are definitions of the different variable names and operations used in FIG. 3:

Preload_Readback_BIST: An input control signal provided by the configuration logic to the BIST controller to start a BIST testing session.

Initialize ADDR, DATA, and COUNTER: Control signals that initialize address generator 250, data generator 260, and error counter 240 of FIG. 2.

INCR_ADDR/INCR_DATA: Signals similar to conventional address and data register increment signals that a bitstream engine requires to write preload data sequentially into embedded block RAM addresses.

SOF: Stop On Fail signal instructs the BIST controller whether to go to the "ERROR" state upon detection of the first BIST error. This signal is a static option selected by the application/user, or it could be hard-coded. If SOF=0, then the BIST controller continues BIST testing until the last address, while error counter 240 keeps a running count of the total number of detected BIST errors.

CMP_ENABLE: Signal produced by the BIST controller that turns on comparator 230 following each read operation.

Compare: Multi-bit signal generated by comparator 230 to indicate whether the most-recent comparison passed, failed, or is ongoing.

INCR_COUNTER: Signal that instructs error counter 240 to increment the value of its Error_Count output. If any bit errors occur in the current comparison performed by comparator 230, then INCR_COUNTER is asserted.

WE: Write enable signal for the embedded memory. In this state diagram, the WE signal controls whether embedded memory 110 is in write or read mode. Alternative implementations may have separate read and write enable signals that are externally controllable and can be made non-overlapping.

Addr_Done: Signal produced by address register 250 to indicate the end of address generation for the current BIST testing session.

BIST_Done: Signal output by the BIST controller 220 to indicate that the current BIST testing session has completed.

Figure 4:
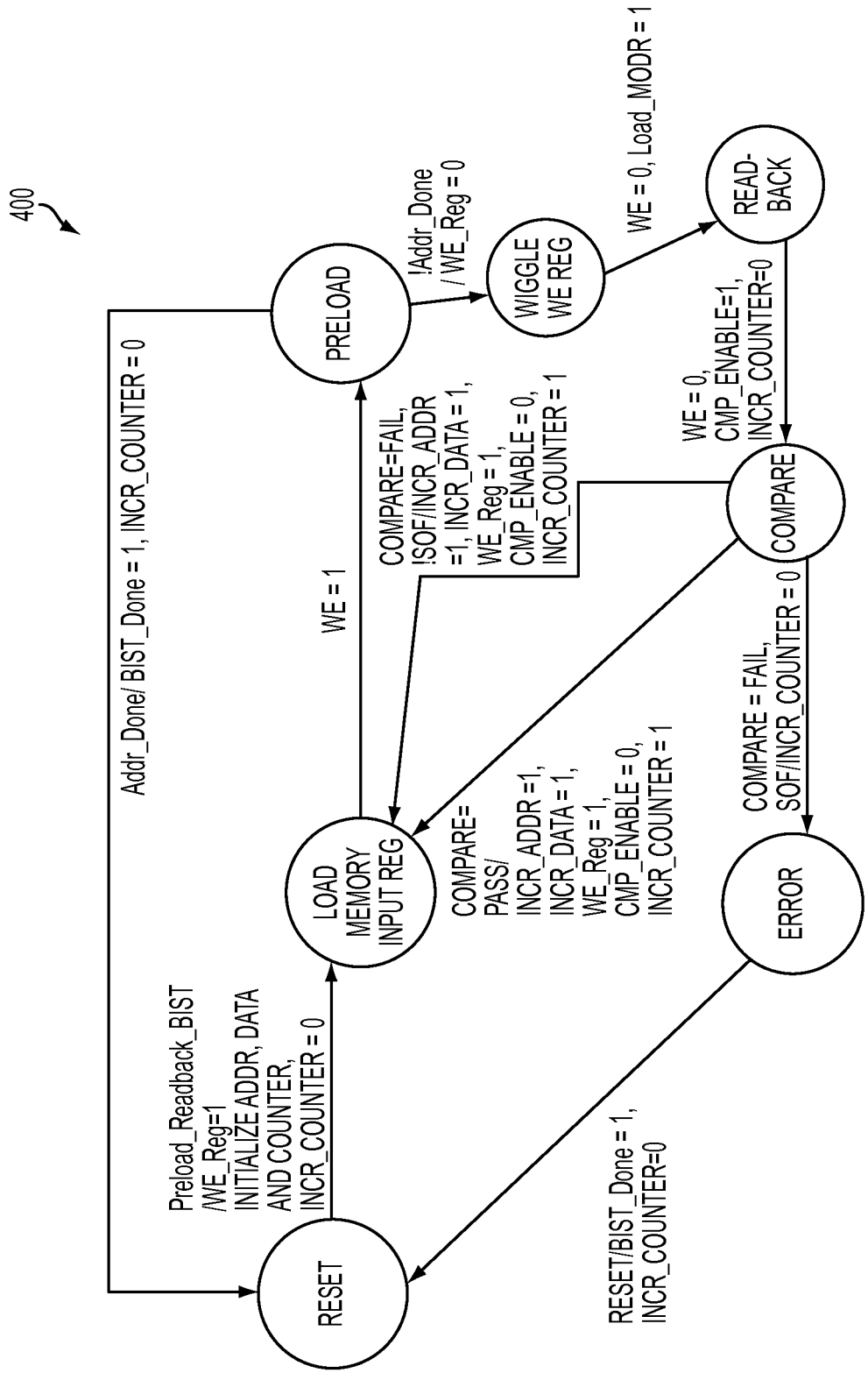

FIG. 4 shows a representation of a finite state machine 400 that may be implemented by BIST controller 220 of FIG. 2 to control the BIST testing of embedded memory 110, which does have input and output registers for data, address, and write-enable signals, according to one possible implementation of the disclosure. As shown in FIG. 4, FSM 400 comprises seven states: Reset, Preload, Read-back, and Error states similar to those in FSM 300 of FIG. 3 plus the following three additional states:

5) Load Memory Input Registers: During which the memory input data register, memory address register, and write-enable register are loaded with initial values with the write-enable register is set to its write-mode value;
6) Wiggle Write-Enable Register: During which the write-enable register is set to its read-mode value; and
7) Compare: During which the memory output and input data registers are compared.

In addition to the same variable names and operations used in FSM 300 of FIG. 3, FSM 400 also uses:

Load Memory Output Data Register (Load_MODR): This signal allows the memory output data register to be loaded with data read out from the embedded memory.

Figure 5:
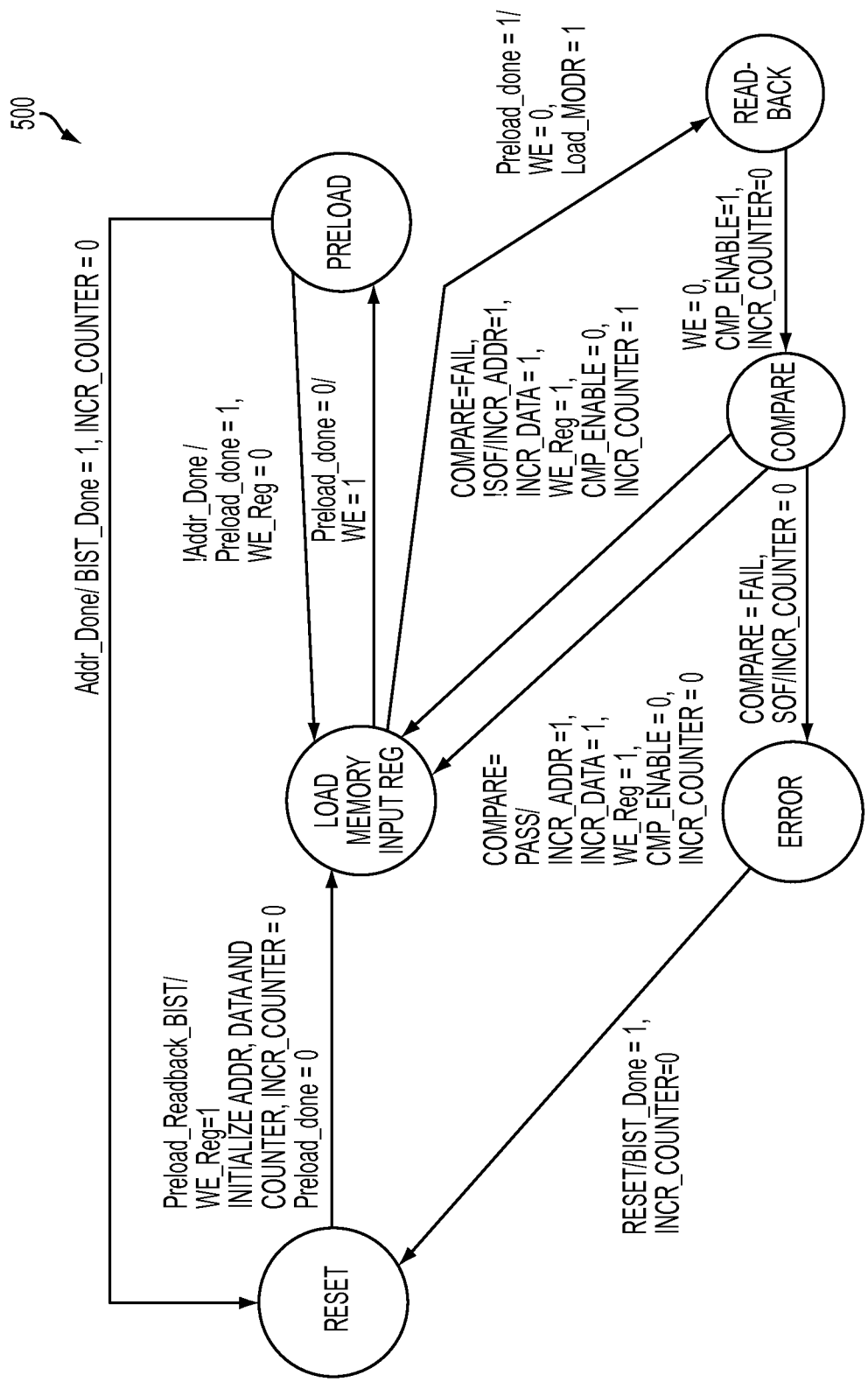

FIG. 5 shows a representation of another finite state machine 500 that may be implemented by BIST controller 220 of FIG. 2 to control the BIST testing of embedded memory 110, according to another possible implementation of the disclosure. FSM 500 is a modified version of FSM 400 of FIG. 4, in which the "Wiggle WE Register" state is eliminated and its operation merged with the "Load Memory Input Register" state, resulting in fewer states in the state diagram and, consequently, less logic to implement in silicon.

Figure 6:
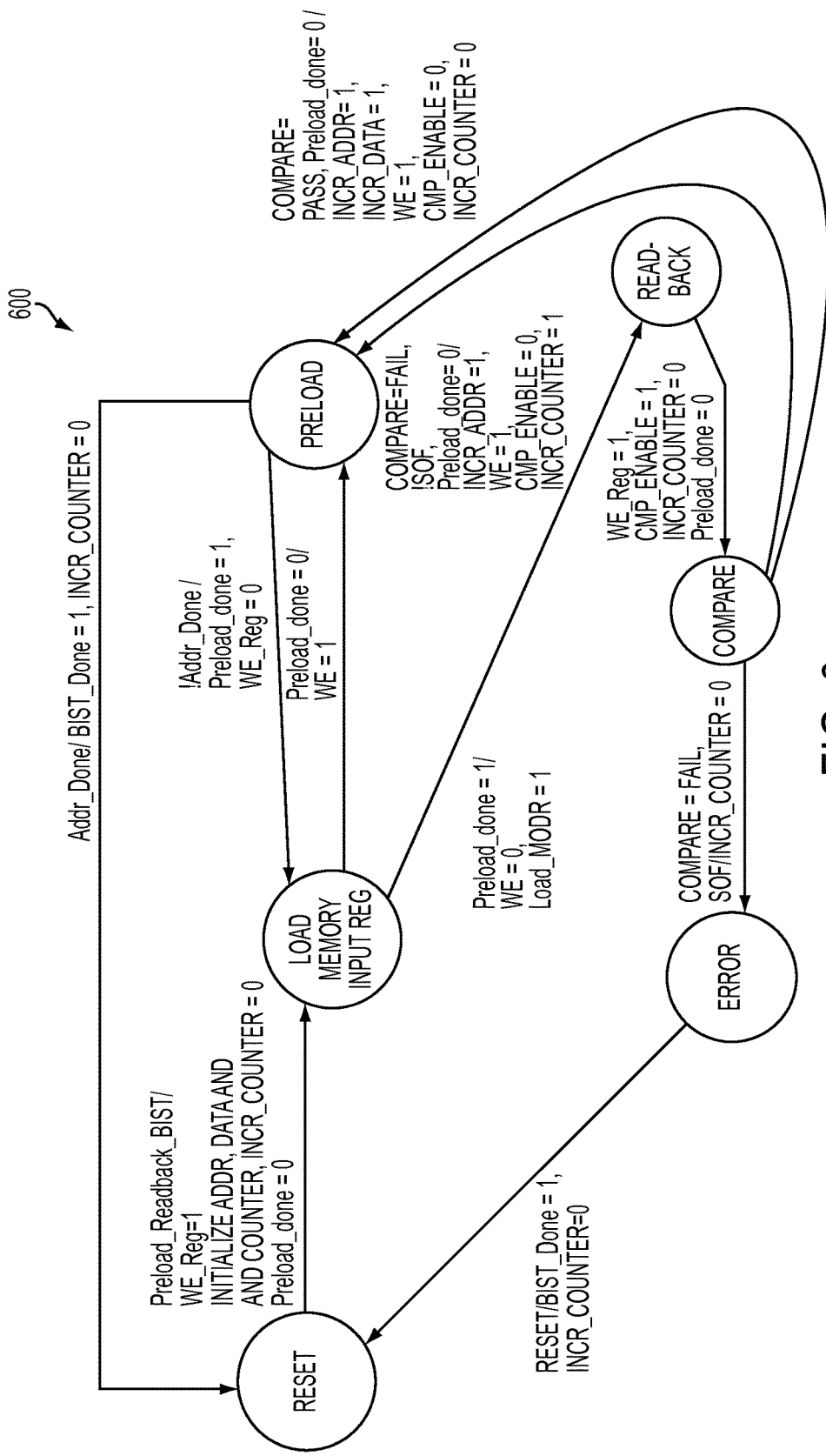

FIG. 6 shows a representation of yet another finite state machine 600 that may be implemented by BIST controller 220 of FIG. 2 to control the BIST testing of embedded memory 110, according to yet another possible implementation of the disclosure. FSM 600 is an improvement over FSM 400 of FIG. 4 and FSM 500 of FIG. 5. Although it uses the same states as FSM 500, it uses one less state transition to go from read to the next write operation, thereby causing higher stress during testing.

Those skilled in the art will understand that other FSM implementations and even non-FSM implementations (such as with asynchronous logic) are possible.

In some implementations, W/RB bus 122 of FIG. 1 is a hard-wired, dedicated, low-latency bus through which the configuration logic of the FPGA can directly communicate with the embedded RAM block for both reads and writes at configuration speed. Furthermore, BIST engine 120 can be designed to function as the BIST master for BIST testing of many (e.g., hundreds) of different blocks of embedded memory in an FPGA using the same W/RB bus 122 for each embedded memory block. In this way, BIST testing can be performed in FPGAs without the latency issues and without the congestion issues of conventional BIST solutions.

Depending on the particular implementation and/or configuration of the FPGA, the data for BIST testing may be generated on-chip or off-chip. For off-chip BIST data generation, address generator 250 and data generator 260 of FIG. 2 would be implemented off-chip rather than being part of BIST engine 120 of FIG. 1.

The disclosure has been described in the context of BIST testing in which a single read operation is performed between every two consecutive write operations, where the write operations are performed at-speed. In alternative implementations, two or more read operations could be performed between every two consecutive write operations. Inserting multiple read operations between successive write operations could be used to test data-retention faults under stress conditions. For example, an SRAM bit cell with a broken PMOS load transistor will lose its charge if read multiple times back to back after a write operation. Such a faulty bit cell might not be detected if only one read operation is performed after each write operation.

In other alternative implementations, one or more read operations could be performed between every two consecutive write operations, where the write operations are performed at speeds slower than configuration speed for the configuration logic, as long as the average number of write and read operations performed during two consecutive configuration-speed clock cycles is greater than two. In general, according to embodiments of the present disclosure, the timing between a write operation and an immediately following read operation is faster than the speed of the configuration logic and is within allowable stress limits for the RAM being tested.

Although the disclosure has been described in the context of embedded memory that uses a single control signal (i.e., the write-enable (WE) signal) to control whether the embedded memory is in write mode or read mode, in other implementations, two or more control signals (e.g., a WE signal and a distinct Read Enable (RE) signal) may be used to configure the embedded memory into its different operating modes. In such cases, the state machine would need to be modified to include additional states for the different modes of read and write operations.

Although the disclosure has been described in the context of BIST testing, which is typically performed by the manufacturer in the factory before releasing the FPGA to the customer, the FPGA may also be able to be configured to enable the customer or other users to perform analogous testing.

Although the disclosure has been described in the context of testing of embedded memory in FPGAs, the disclosure may also be implemented in the context of testing embedded memory in other suitable IC devices, such as ASICs and microprocessors.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value or range.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It will be further understood that various changes in the details, materials, and arrangements of the parts which have been described and illustrated in order to explain embodiments of this invention may be made by those skilled in the art without departing from embodiments of the invention encompassed by the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method for testing embedded memory in a field-programmable gate array (FPGA) device, the embedded memory having an at-speed configuration frequency, the method comprising:
    (a) performing a number of write operations to write sets of configuration data into the embedded memory to configure the FPGA device;
    (b) performing at least one read operation after each write operation to read back the previous written set of configuration data from the embedded memory as read-back data, wherein each of the write and read operations are performed at a frequency greater than the at-speed configuration frequency;
    (c) comparing the read-back data to the configuration data to detect an embedded memory testing error;
    wherein the method is performed by a memory-testing engine of the FPGA separate from the embedded memory, separate from a programmable logic fabric of the FPGA, and connected to the embedded memory by a hardwired data bus; and
    wherein the memory-testing engine is implemented in a configuration bitstream engine of the FPGA device.

2. The method of claim 1, wherein step (b) comprises performing only one read operation between consecutive write operations.

3. The method of claim 1, wherein step (b) comprises performing two or more read operations between consecutive write operations.

4. The method of claim 1, wherein:
    each write operation is based on an address value stored in an address register for the embedded memory; and
    after each write operation, the at least one read operation is performed without changing the address value stored in the address register from the address value used during the previous write operation.

5. A field-programmable gate array (FPGA) device comprising:
    a programmable logic fabric;
    an embedded memory having an at-speed configuration frequency;
    a memory-testing engine separate from the embedded memory and the programmable logic fabric;
    a hardwired data bus connecting the memory-testing engine to the embedded memory, wherein the memory-testing engine is configured to:
        (a) perform a number of write operations to write sets of configuration data into the embedded memory to configure the FPGA device;
        (b) perform at least one read operation after each write operation to read back the previous written set of configuration data from the embedded memory as read-back data, wherein each of the write and read operations are performed at a frequency greater than the at-speed configuration frequency; and
        (c) compare the read-back data to the configuration data to detect a memory testing error; and
    wherein the memory-testing engine is implemented in a configuration bitstream engine of the FPGA device.

6. The FPGA device of claim 5, wherein the memory-testing engine is configured to perform only one read operation between consecutive write operations.

7. The FPGA device of claim 5, wherein the memory-testing engine is configured to perform two or more read operations between consecutive write operations.

8. The FPGA device of claim 5, wherein:
    each write operation is based on an address value stored in an address register for the embedded memory; and
    after each write operation, the memory-testing engine is configured to perform the at least one read operation without changing the address value stored in the address register from the address value used during the previous write operation.

9. The FPGA device of claim 5, wherein the memory-testing engine comprises:
    a memory-testing controller configured to control operations of the memory-testing engine;
    a comparator configured to compare the read-back data to the configuration original data to detect the memory testing error; and
    an error counter configured to count each memory testing error.

10. The FPGA device of claim 9, wherein the memory-testing engine further comprises:
    an address generator configured to generate memory address values for the write operations; and
    a data generator configured to generate the sets of configuration data.

* * * * *